(12) United States Patent
Artmann et al.

(10) Patent No.: US 9,309,111 B2
(45) Date of Patent: Apr. 12, 2016

(54) MICROMECHANICAL COMPONENT AND METHOD FOR PRODUCING A MICROMECHANICAL COMPONENT

(71) Applicant: Robert Bosch GmbH, Stuttgart (DE)

(72) Inventors: Hans Artmann, Boeblingen-Dagersheim (DE); Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/538,489

(22) Filed: Nov. 11, 2014

(65) Prior Publication Data
US 2015/0131136 A1 May 14, 2015

(30) Foreign Application Priority Data
Nov. 11, 2013 (DE) .......................... 10 2013 222 823

(51) Int. Cl.
G02B 26/08 (2006.01)
B81C 3/00 (2006.01)
B81B 3/00 (2006.01)

(52) U.S. Cl.
CPC .............. *B81C 3/007* (2013.01); *B81B 3/0048* (2013.01); *G02B 26/0841* (2013.01); *B81B 2201/042* (2013.01); *H01L 2224/16225* (2013.01); *H01L 2924/16152* (2013.01); *Y10T 29/49128* (2015.01)

(58) Field of Classification Search
CPC .......... H01L 2224/16225; H01L 2924/16152; Y10T 29/49128; B81B 2201/042; B81B 3/0048; B81C 3/007; G02B 26/0841; G02B 26/0858; G02B 26/085; G02B 26/0833
See application file for complete search history.

(56) References Cited

U.S. PATENT DOCUMENTS 8,361,331 B2 1/2013 Yang et al.
2003/0122206 A1* 7/2003 Bhattarai .................. B81B 7/04
257/415

* cited by examiner

Primary Examiner — James Phan
(74) Attorney, Agent, or Firm — Kenyon & Kenyon LLP

(57) ABSTRACT

A micromechanical component is described having a first substrate that has a first front side a first rear side facing away from the first front side; first printed conductors that are fashioned on the first front side of the first substrate; a plurality of actuator devices that are fashioned on and/or in the first substrate and that are electrically bonded to the first printed conductors, the actuator devices each having at least one stator electrode and each having at least one actuator electrode that works together with the at least one stator electrode, which are fashioned such that a voltage can be applied between the actuator electrode and cooperating stator electrode in such a way that the actuator electrode can be displaced relative to the stator electrode.

12 Claims, 13 Drawing Sheets

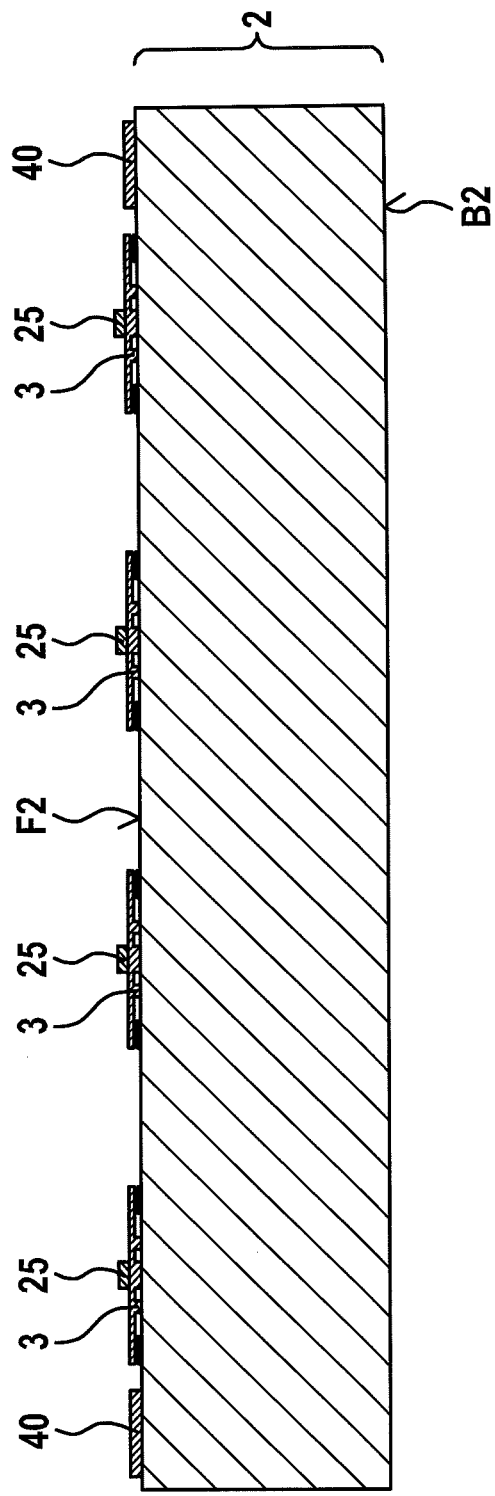

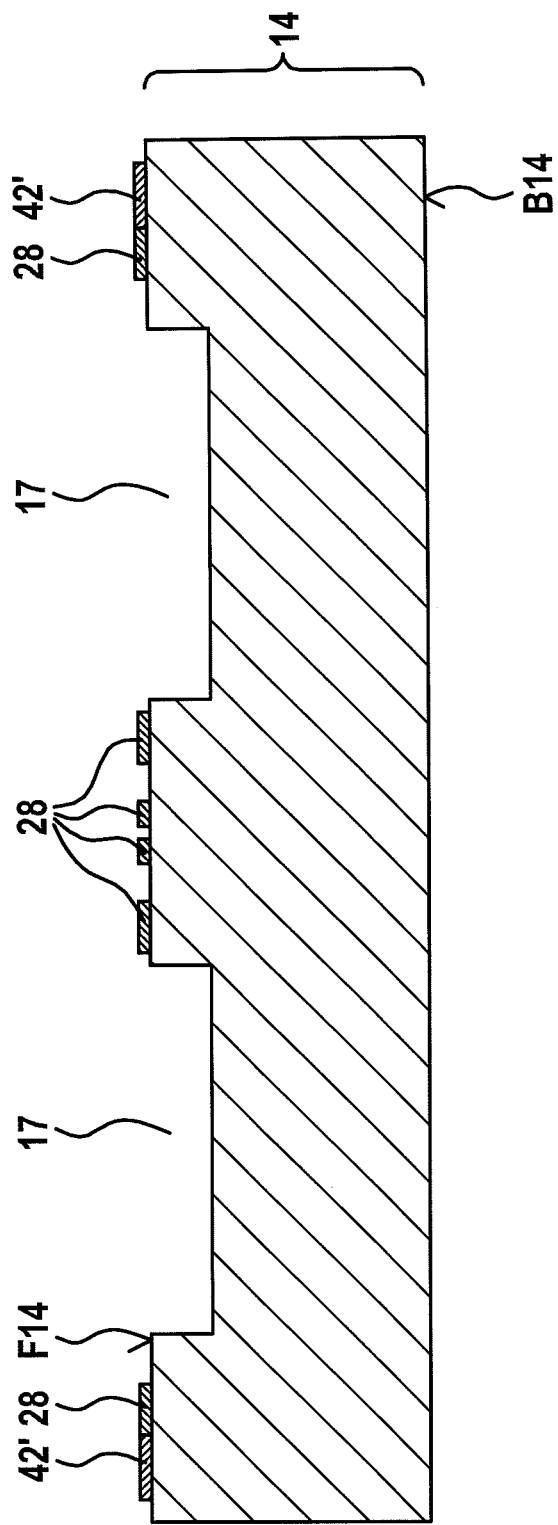

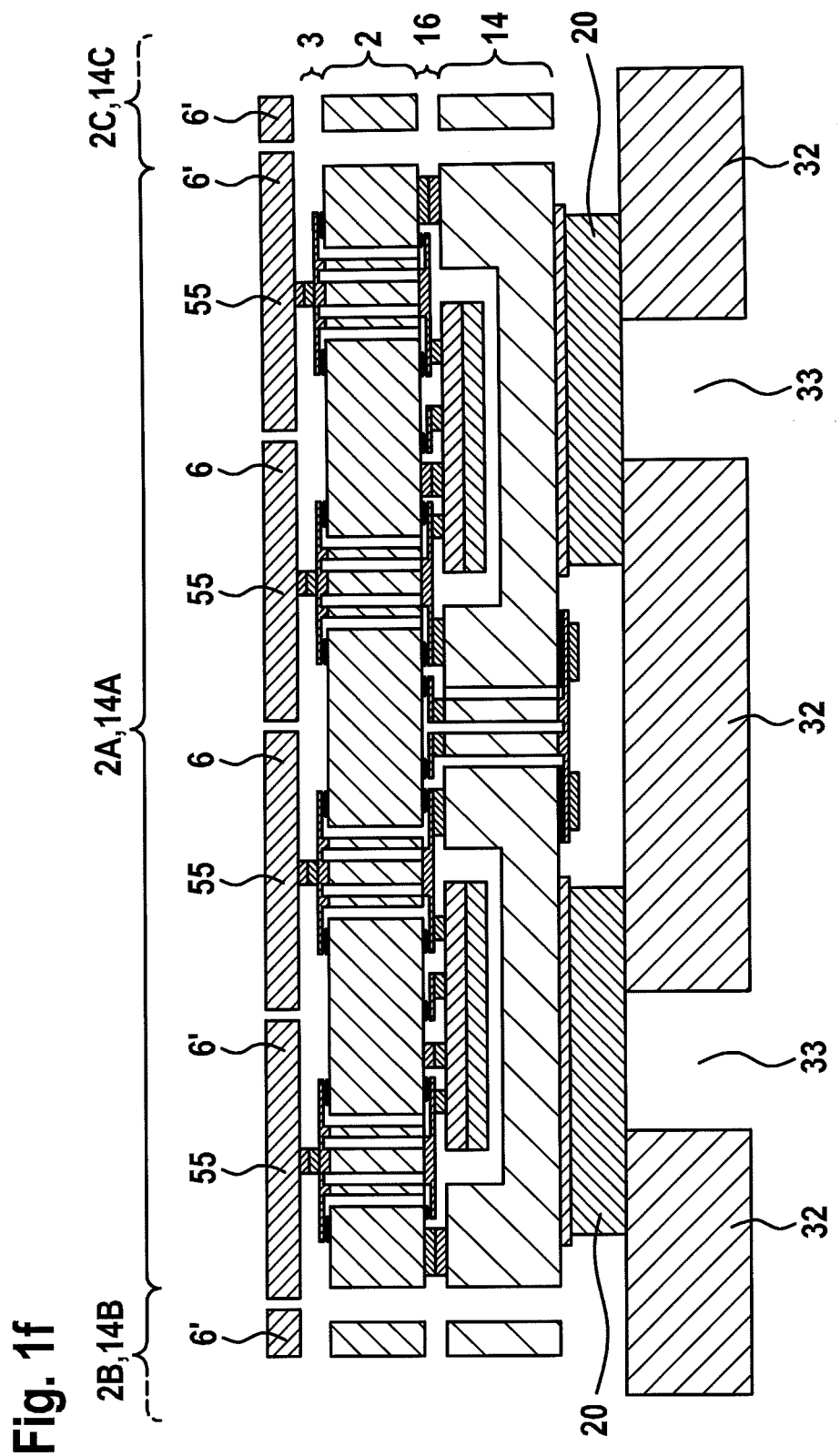

Fig. 1e-i
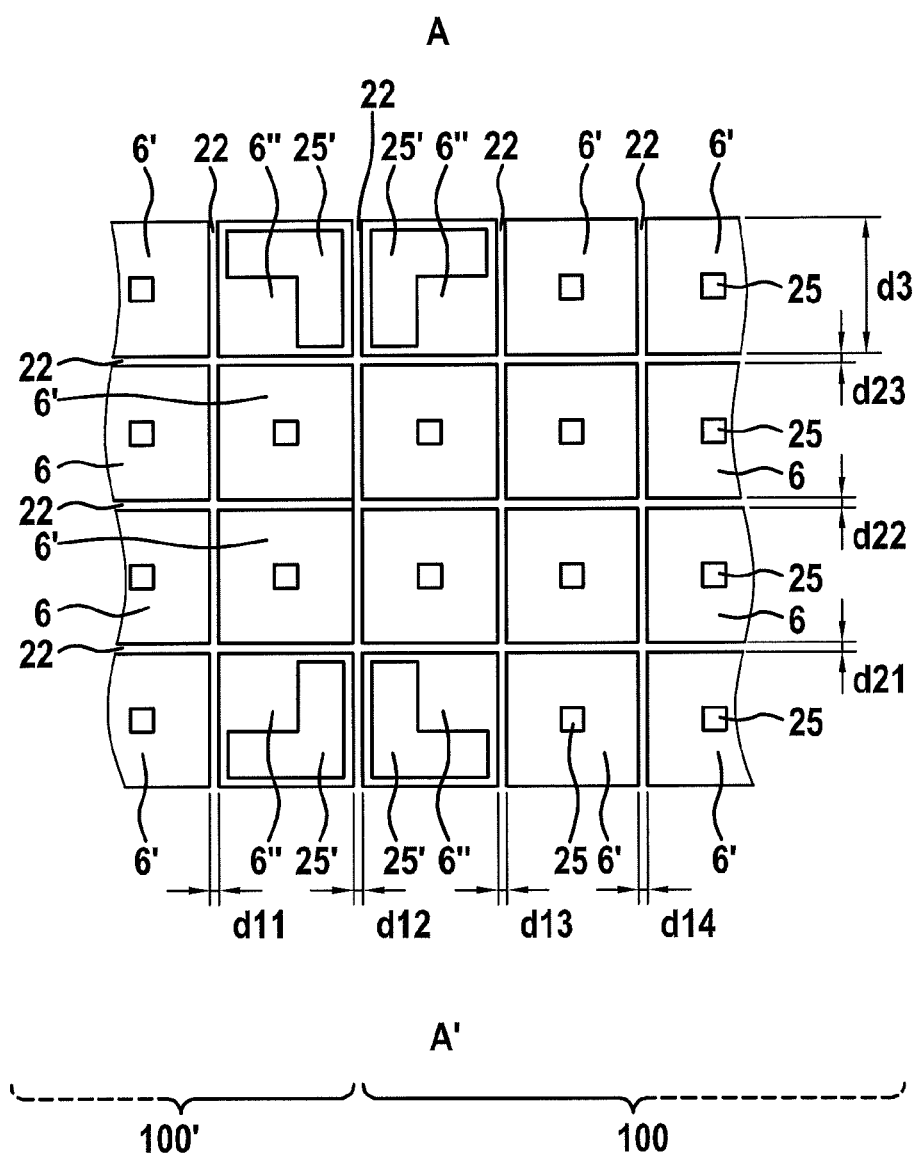

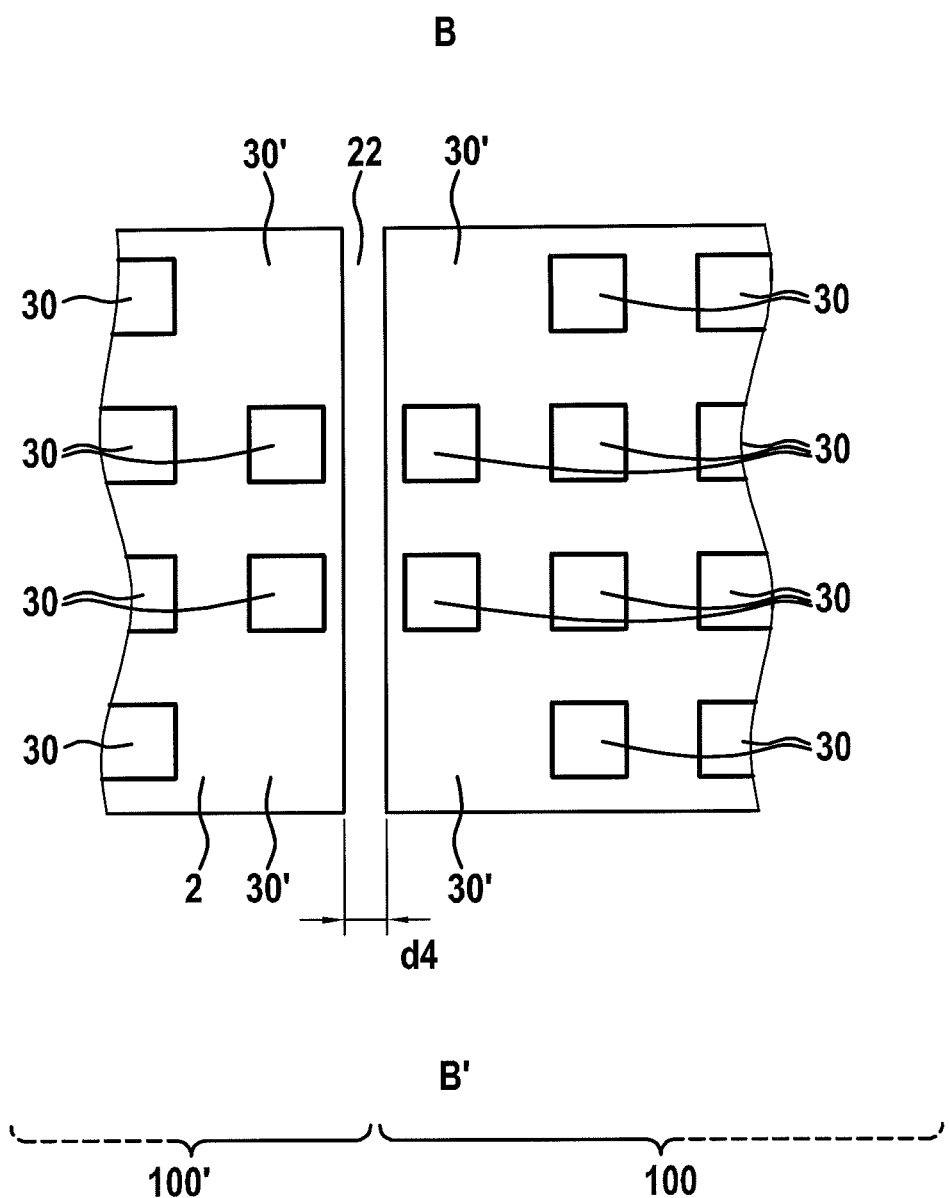

Fig. 1e-iii
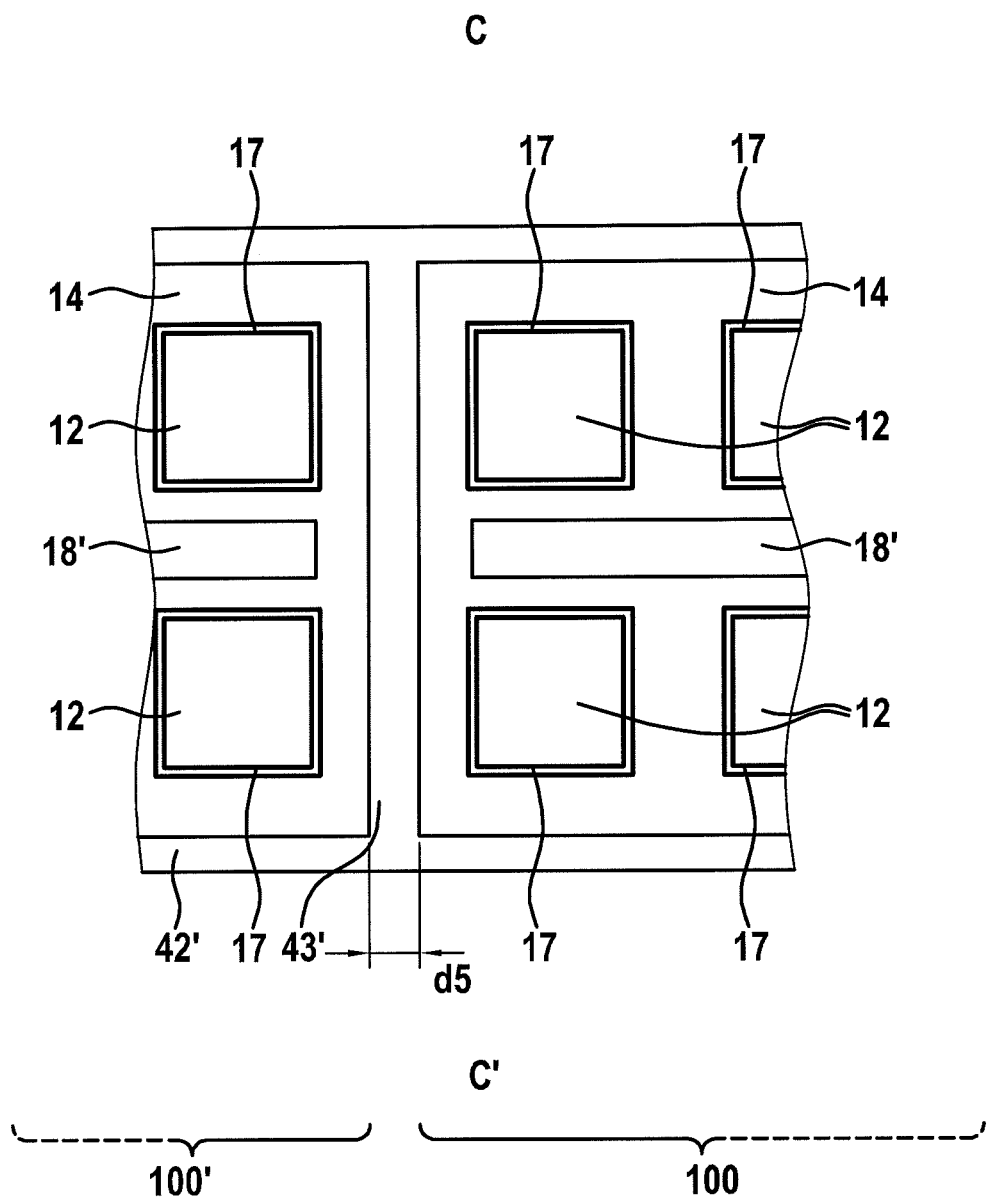

Fig. 1e-iv
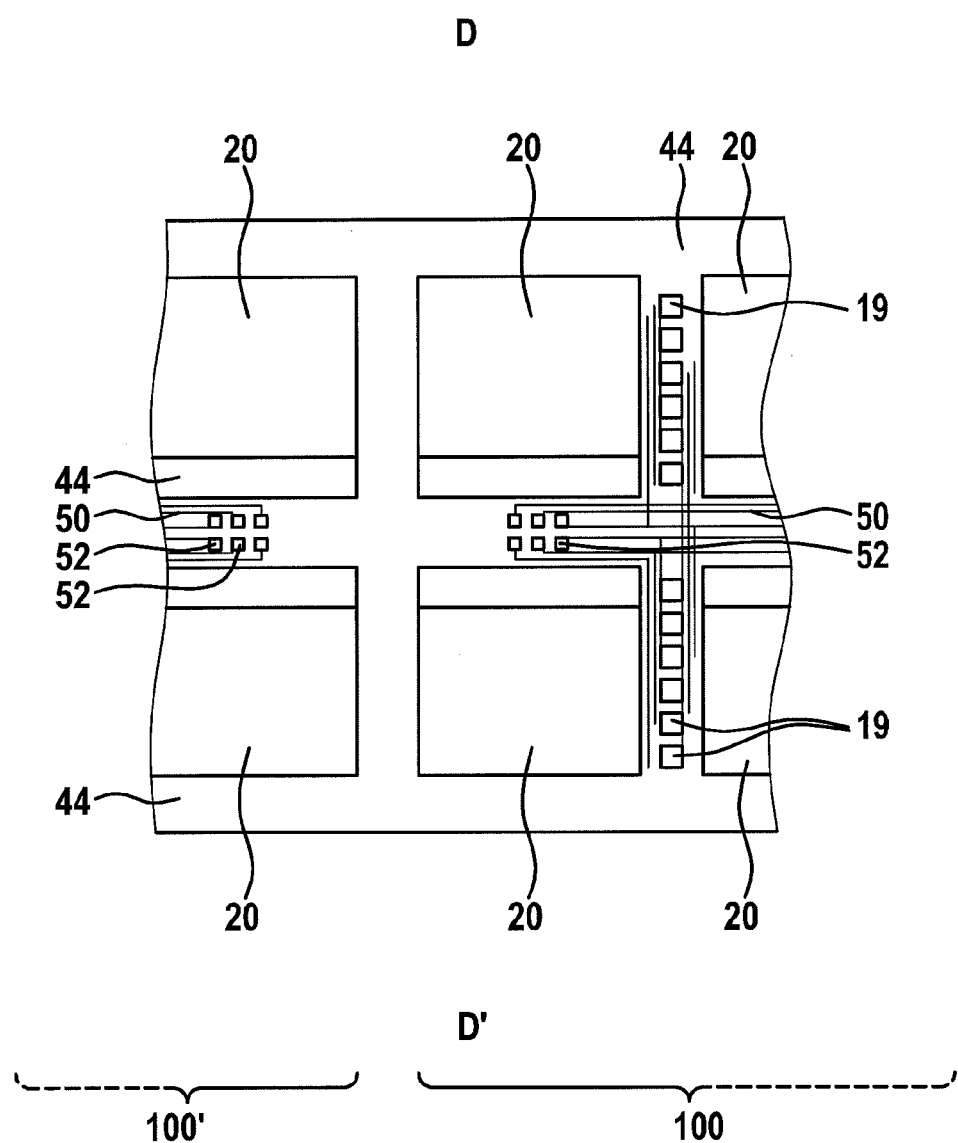

MICROMECHANICAL COMPONENT AND METHOD FOR PRODUCING A MICROMECHANICAL COMPONENT

FIELD OF THE INVENTION

The present invention relates to a micromechanical component and to a method for producing a micromechanical component.

BACKGROUND INFORMATION

Micromechanical components, in particular micro-mirror arrays, are installed in a large number of devices. Often, it is desirable to be able to place a plurality of identical or similar micro-mirror arrays closely alongside one another in order for example to cover large surfaces with micro-mirrors.

In U.S. Pat. No. 8,361,331, a micro-electromechanical mirror and a corresponding production method are described. Here, flat electrodes by which the mirror is movable are situated on a surface of a CMOS chip on which the mirror is fashioned, the electrodes being situated parallel to the surface.

SUMMARY

The present invention discloses a micromechanical component, and a method for producing a micromechanical component.

According to the present invention, on the surface of a micromechanical component a stable frame structure can be provided in order to make it possible to grasp the individual components from above or to process them. In particular, the components, produced for example in a wafer composite, can be separated without mechanically stressing the sensitive active surface of the components, for example mirror elements of micro-mirrors. The micromechanical components according to the present invention can in addition be fashioned differently in accordance with an achievable or desired degree of precision in the positioning of the component. In this way, a very good balance can be provided between an active surface of the components that is as large as possible and a reduced risk of lateral damage (particle risk).

According to a preferred development of the micromechanical component according to the present invention, the first printed conductors and the second printed conductors are electrically connected to one another within the first substrate. In this way, printed conductors or contact elements for example on the edges of the substrate can be avoided. In this way, the sensitivity of the component can be reduced, and the component can be used in a more versatile fashion.

According to a further preferred development, on each of the actuator devices there is fashioned at least one mirror element that is connected to the at least one actuator electrode and that can be adjusted together with the at least one actuator electrode, the mirror element having a reflective surface. In this way, the component can be fashioned as a low-cost and robust micro-mirror or micro-mirror array.

According to a further preferred development, at least one spacing between two adjacent mirror elements in at least one direction parallel to the first front side is smaller, by at least a factor of 8, than a width of the two adjacent mirror elements in the same direction. In this way, the reflective overall surface of the component fashioned as a micro-mirror array is increased, improving its efficiency and making the component more reliable.

According to a further preferred development, a second substrate, having a second front side and having a second rear side facing away from the second front side is fastened via its second front side to, over, and/or on the second printed conductors, the second substrate having, on the second front side, at least one opening within which the at least one control ASIC is situated. In this way, the control ASIC can be protected from damaging influences. In addition, the second substrate can provide the component with better stability and robustness.

According to a further preferred development, at least one ferromagnetic assembly element is situated on the second rear side of the second substrate. This can make installation of the component easier, and can enable a stable mounting of the component on a magnetic foundation, for example a structured magnetic bearer substrate. According to a further preferred development, at least one ferromagnetic assembly element can also be glued on the at least one control ASIC.

According to a further preferred development, the second substrate has at least one via from the second rear side to the second front side, the at least one via being electrically connected respectively to the second printed conductors and to at least one contact surface on the second rear side of the second substrate. Thus, in a simple and low-cost manner the controlling can be enabled of all elements of the component from a rear side, i.e. for example a side of the component facing away from the reflective surface. In this way, the surface can be fashioned particularly densely with desired elements, such as mirror elements, without having to leave room for contact surfaces.

According to a preferred development of the method, a second substrate, having a second front side and having a second rear side facing away from the second front side, is fastened, via its second front side, to, over, and/or on the second printed conductors, the at least one control ASIC being situated in at least one opening fashioned on the second front side of the second substrate.

According to a further preferred development, a plurality of mirror elements situated at a distance from one another are etched out from a semiconductor layer of a wafer, using an insulating layer situated between the semiconductor layer and a base substrate of the wafer as an etch stop layer, the mirror elements being fastened to, over, and/or on the first printed conductors, the base substrate and the insulating layer being removed in order to expose the mirror elements, and reflective surfaces being fashioned on the exposed mirror elements.

According to a further preferred development, at least one bridging element is fashioned on the first front side of the first substrate, and after the formation of the at least one bridging element at least one continuous separating trench going from the first rear side to the first front side through the first substrate on the at least one bridging element is fashioned in such a way that regions are structured out from the first substrate that remain mechanically connected to one another via the at least one bridging element, the at least one bridging element being removed during a later separation of micro-electromechanical components.

BRIEF DESCRIPTION OF THE DRAWINGS

FIGS. 1a through 1g show cross-section-type side views and plan view-type views of a micromechanical component produced by a specific embodiment of the method, FIGS. 1a-i through 1e-iv schematically showing the plan view-type views of various segments.

DETAILED DESCRIPTION

Figure 1B:
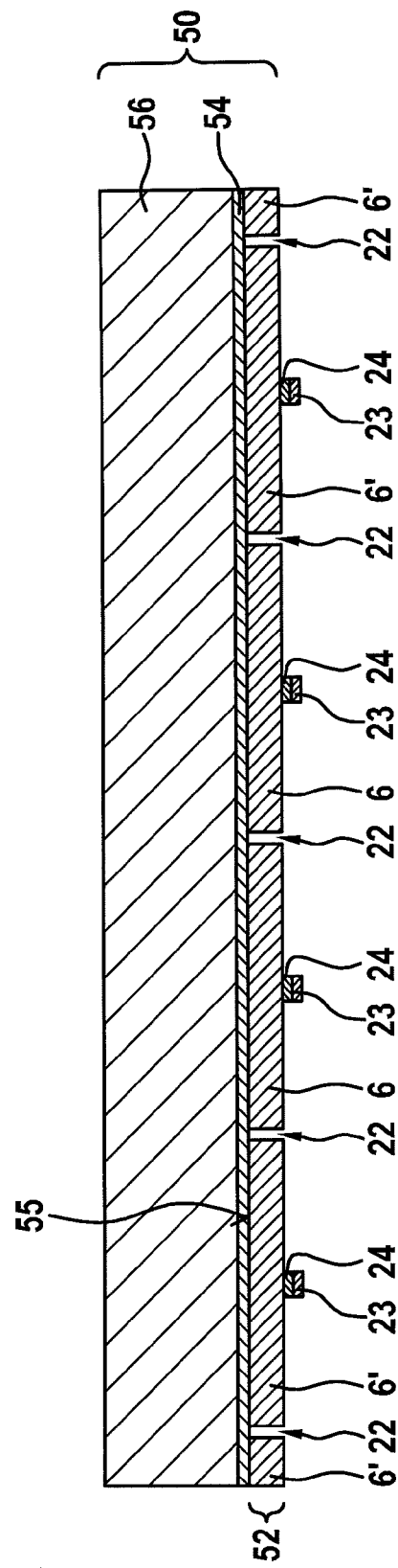

In all Figures, identical or functionally identical elements and devices have been provided with the same reference characters, unless otherwise indicated.

FIGS. 1a through 1g show cross-section-type side views and plan view-type views of a micromechanical component produced using a specific embodiments of the method, FIGS. 1e-i through 1e-iv schematically reproducing the plan view-type views of various segments.

In a first method step, according to FIG. 1a first printed conductors 3 are fashioned on a first front side F2 of a first substrate 2. Substrate 2 can for example be a semiconductor substrate, in particular a silicon substrate (or a monocrystalline silicon substrate). Substrate 2 can be at least partly doped in such a way that it has electrically conductive regions. First rear side B2 of first substrate 2 is situated on a side of first substrate 2 facing away from first front side F2.

At least one bridging element 40, in particular made of an oxide, such as a silicon dioxide, is fashioned on first front side F2 of first substrate 2. As the production method continues, the at least one bridging element 40 can act to mechanically hold together micromechanical components produced together until they are separated. Moreover, first contacts 25, in particular aluminum contacts 25, can be fashioned in and/or on first printed conductors 3; the function of these contacts is further described below.

FIG. 1b shows a wafer 50, in particular an SOI wafer, that has a base substrate 56, a semiconductor layer 52, and an insulating layer 54 enclosed between base substrate 56 and semiconductor layer 52. The dimensions of the base surface of wafer 50 can correspond to those of first front side F2 of first substrate 2, first rear side B2 of first substrate 2, a second front side F14 of a second substrate 14, and/or a second rear side B14 of second substrate 14 (see FIG. 1d). Insulating layer 54 has in particular an oxide, such as silicon dioxide. Advantageously, insulating layer 54 is made of the same material, or the same materials, as the at least one bridging element 40, so that insulating layer 54 and the at least one bridging element 40 can be etched together in a later method step.

Mirror elements 6, 6' are structured out from semiconductor layer 52, for example by etching, in particular using a trench process; here, insulating layer 54 can act as an etch stop layer. In addition, at least one continuous trench 22 is structured through semiconductor layer 52. Mirror elements 6 can have a quadratic base surface on their side oriented toward insulating layer 54. Advantageously, a spacer element 24 is fashioned in the center of its side facing away from insulating layer 54. The shape of mirror elements 6, 6' can thus be described as a "mushroom shape" having spacer element 24 as "stem" and the quadratic base surface as "cap." After the production method has concluded, spacer element 24 can enable better mobility of the respective mirror element 6, 6' by increasing a spacing between the "cap" of the "mushroom shape" and a surface at the "foot of the stem." Mirror elements 6, 6' can all be made with the same shape and/or the same dimensions. However, mirror elements 6, 6' can also be fashioned each having different shapes and/or different dimensions.

On an end of each spacer element 24 oriented away from insulating layer 54, there can be fashioned second contacts 23, in particular germanium contacts 23. During production, spacer elements 24 and second contacts 23 can be structured out/etched out together. This can advantageously also take place during the above-mentioned trench process.

Figure 1C:
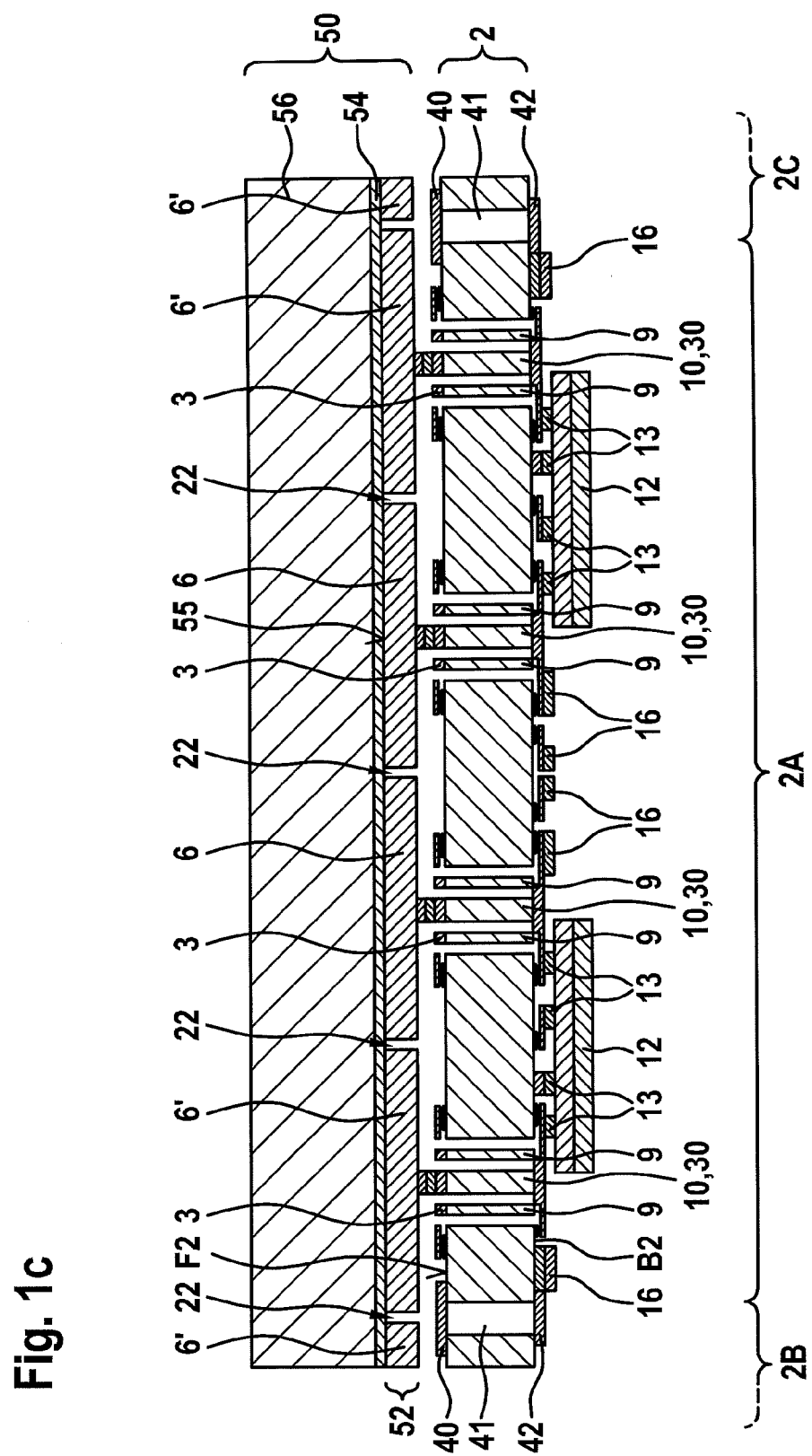

According to FIG. 1c, in a further method step wafer 50 is bonded onto first substrate 2. For this purpose, first contacts 25 are joined and bonded to second contacts 23. For example, an AlGe or AlGeSi bonding is possible. (The bonding takes place in such a way that mirror elements 6, 6' are each mechanically connected to at least one actuator electrode 10 (formed later) in such a way that when the at least one actuator electrode 10 is displaced, mirror elements 6, 6' can also be displaced). Moreover, after the bonding of wafer 50 onto first substrate 2, at least some of trenches 22 can be situated over the at least one bridging element 40.

Optionally, first substrate 2 can be subsequently thinned, starting from first rear side B2. Moreover, a plurality of actuator devices 30 are fashioned on and/or in first substrate 2 and are electrically and/or mechanically bonded to first printed conductors 3. Actuator devices 30 each have at least one stator electrode 9 and each have at least one actuator electrode 10 that works together with the at least one stator electrode 9. Through the application of a voltage between the at least one stator electrode 9 and the at least one cooperating actuator electrode 10, the corresponding actuator electrode 10 can be displaced relative to the corresponding stator electrode 9. Thus, actuator electrodes 10 are movable relative to the rest of the component, while stator electrodes 9 remain static relative to the rest of the component, with the exception of actuator electrodes 10.

Actuator devices 30, in particular electrodes 9 and 10, can for example be structured out from first substrate 2. For this purpose, continuous structuring trenches can be drawn through first substrate 2, thereby forming electrodes 9 and 10 with a maximum extension equal to a layer thickness of first substrate 2. The application of the voltage between electrodes 9 and 10 can therefore result in comparatively large forces for the displacement of mirror elements 6, 6'. Alternatively, however, stator and actuator electrodes 9, 10 can also be oriented parallel to first front side F2 of first substrate 2. Actuator devices 30 can be suspended for example on first substrate 2 via spring devices that are fashioned on and/or over first front side F2 of first substrate 2.

Moreover, in first substrate 2 at least one continuous first separating trench 41 is fashioned in such a way that regions 2A, 2B, 2C of first substrate 2 are structured out. The at least one first separating trench 41 is fashioned adjacent to the at least one bridging element 40 in such a way that regions 2A, 2B, 2C of first substrate 2 remain mechanically connected to one another. The at least one first separating trench 41 can be etched from first rear side B2 of first substrate 2 for example by a trench process, and here the at least one bridging element 40 can act as etch stop layer. The at least one first separating trench 41 can moreover be situated relative to trenches 22 in such a way that at least one axis (not shown) can be defined that runs through the at least one first separating trench 41 and through at least one of the trenches 22. A width of first separating trench 41 can be greater than a width of trenches 22. Depending on the specific realization of stator and actuator electrodes 9 and 10, these can be fashioned using the same trench process as is used for first separating trench 41.

Subsequently, second printed conductors 16 are fashioned on first rear side B2 of first substrate 2. According to FIG. 1c, second printed conductors 16 can have multiple mechanical and/or electrical connections to second substrate 2. The concrete realization in each case is a function for example of the concrete realization of actuator devices 30.

In addition, at least one control ASIC 12 is fastened to, over, and/or on first rear side B2 of first substrate 2. For this purpose, contact surfaces 13, in particular aluminum or gold contact surfaces, can be fashioned in, on, and/or over second printed conductors 16, to which surfaces the at least one control ASIC 12 is bonded. The at least one control ASIC 12 can advantageously be connected electrically and/or mechanically to first substrate 2 by a gold/gold or gold/aluminum connection. In particular, the at least one control ASIC 12 is electrically connected, via second printed conductors 16, to stator electrodes 9 and to actuator electrodes 10 in such a way that the voltage that can be applied between the at least one stator electrode 9 and the at least one cooperating actuator electrode 10 of each actuator device 30 can be controlled by the at least one control ASIC 12.

Exactly one control ASIC 12 can be provided for each actuator device 30. Likewise, however, a plurality of actuator devices 30 can be controlled by the same control ASIC 12. Alternatively, it is also possible to provide at least two control ASICs 12 per actuator device 30. As is shown in FIG. 1c, control ASICs 12 can be fashioned symmetrically between each two actuator devices 30. Alternatively, however, any other configuration of control ASICs 12 is also possible.

In addition, a second substrate 14 is structured according to FIG. 1d, having a second front side F14 and a second rear side B14. On second front side F14 of second substrate 14, at least one opening 17 is fashioned in such a way that each such opening can completely accommodate at least one control ASIC 12. Contact surfaces 28, in particular having germanium or gold, are fashioned on the regions of second front side F14 of second substrate 14 in which no opening 17 is fashioned. For example, first a germanium or gold layer can be deposited on second front side F14 of second substrate 14, and this layer is then structured in the same process in which the at least one opening 17 is fashioned, for example using a photo mask. The structuring of contact surfaces 28 shown in FIG. 1d is to be understood only as an example. For better stability, contact surfaces 28 can also be fashioned in the at least one opening 17 on which control ASICs 12 can be bonded (not shown).

On second front side F14, in addition at least one covering element 42' can be fashioned in such a way that the at least one covering element 42' lies against the at least one covering element 42 after the joining of substrates 2 and 14. In this way, the obtained layer construction can be given additional stability.

Figure 1E:
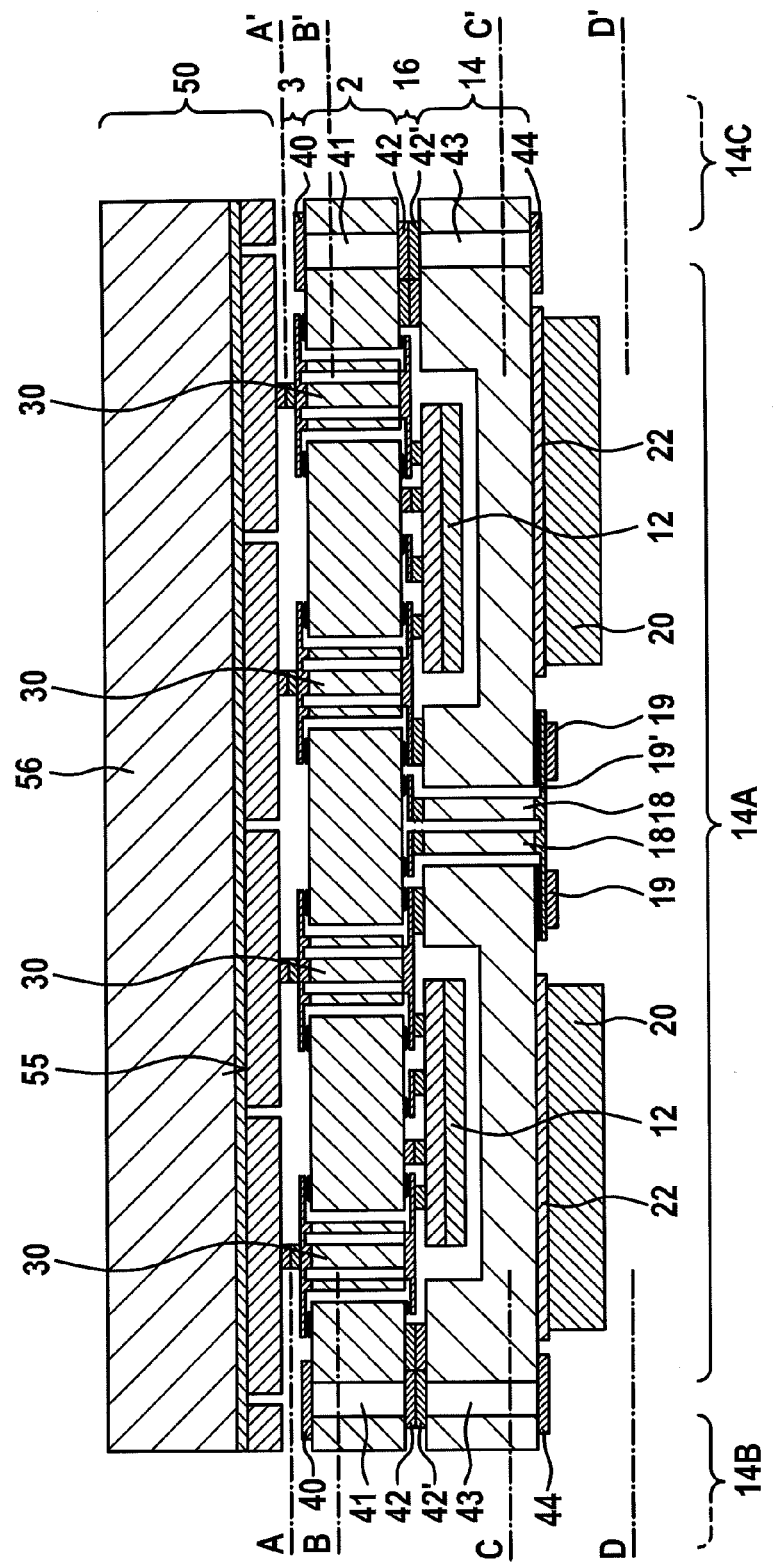

According to FIG. 1e, in a further method step second substrate 14 is fastened, via second front side F14, on, to, and/or over second printed conductors 16, for example being bonded on. Preferably, a gold/gold direct bonding, or a eutectic Al/Ge bonding, via contact surfaces 28 is used.

Second substrate 14 can optionally be thinned starting from second rear side B14, for example through grinding and/or etching. Moreover, at least one via 18 can be fashioned that extends from second rear side B14 up to second front side F14, through second substrate 14. The at least one via 18 is electrically connected to second printed conductors 16. The at least one control ASIC 12 can preferably be controlled via the at least one via 18 and second printed conductors 16.

In addition, in second substrate 14 at least one continuous second separating trench 43 is fashioned in such a way that regions 14A, 14B, 14C of second substrate 2 are structured out. The at least one second separating trench 43 is fashioned on the at least one bridging element 42, 42' in such a way that regions 14A, 14B, 14C continue to be mechanically connected to one another via the at least one bridging element 42, 42'. The at least one second separating trench 43 can be etched from second rear side B14 of second substrate 14 using a trench process; here, the at least one bridging element 42' can act as etch stop layer. The at least one second separating trench 43 can in addition be fashioned along at least one axis that runs through at least one of the trenches 22 and the at least one first separating trench 41.

The at least one second separating trench 43 can be produced in the same production step as the at least one via 18. The at least one second separating trench 43 can in addition be terminated at second rear side B14 of second substrate 14 with at least one bridging element 44. In this way, the mechanical stability of the component can be increased. The at least one bridging element 44 can have for example an oxide, in particular silicon dioxide.

Third printed conductors 19' having a plurality of contact surfaces 19 are fashioned on second rear side B14 of second substrate 14. Contact surfaces 19 are connected electrically to the at least one via 18 in such a way that via contact surfaces 19, control ASICs 12 can be controlled for the operation of actuator devices 30 (or stator and actuator electrodes 9, 10).

In a further method step, assembly elements 20 can be provided on second rear side B14 of second substrate 14. Assembly elements 20 can in particular be fashioned as ferromagnetic strips that are glued on by an adhesive layer 22. Contact surfaces 19 are at least incompletely covered by assembly elements 20.

In FIG. 1e, in addition four sectional planes A-A', B-B', and C-C' are shown, which are explained in more detail with reference to the following FIGS. 1e-i through 1e-iv.

FIG. 1e-i shows a schematic plan-type view of a first segment of the layer construction along the sectional plane A-A', which runs parallel to first front side F2 of first substrate 2 through first and second contacts 23 and 25, which are bonded to one another. Reference characters 100 and 100' indicate the components of the first segment, which are assigned to a (later) first micromechanical component 100 and to a (later) second micromechanical component 100'.

Preferably, mirror elements 6, 6', situated centrically on later micromechanical components 100 and 100', each have a first contact 25, in particular made of aluminum, having a quadratic shape. Mirror elements 6", which are situated at the corners of later micromechanical components 100 and 100', preferably have L-shaped first contacts 25' having a large surface, in particular made of aluminum, the tip of the L-shape pointing in the direction of the respective corner of the later micromechanical component 100 and 100' to which mirror element 6" is assigned. Mirror elements 6" situated at the corners of the later micromechanical components 100 and 100' can contribute to improved stability of the components in that they are attached at the edges and/or at the corners of the components as passive, i.e. immovable, mirror elements 6". Passive mirror elements 6" can be fashioned so as to be identical in design to movable mirror elements 6, 6' that are situated at the center of later micromechanical components 100 and 100'. Under passive mirror elements 6", between first substrate 2 and second substrate 14 there can be fashioned bonding contact surfaces that can further increase the stability of the micromechanical component. These bonding contact surfaces between first substrate 2 and second substrate 14 can have the same shape and/or the same materials as L-shaped first contacts 25', and can be situated so as to coincide with these.

Spacings d11, d12, d13, d14, d21, d22, d23 between each two adjacent mirror elements 6, 6', 6" in at least one direction parallel to first front side F2 can be smaller for example by at least a factor of 8, in particular by a factor of 10, preferably by a factor of 15, more preferably by a factor of 20, smaller than a width of mirror elements 6, 6' in the same direction (e.g. an edge length d3). In this specific embodiment, spacings d11, d12, d13, d14, d21, d22, d23 are all made equal. The width of spacings d11, d12, d13, d14, d21, d22, d23 corresponds in particular to a width of trenches 22. The width of spacings d11, d12, d13, d14, d21, d22, d23 can however also be different.

FIG. 1*e-ii* shows a schematic plan-type view of a second segment of the layer construction along the sectional plane B-B', which runs parallel to first front side F2, centrically through first substrate 2.

According to FIG. 1*e-ii*, a plurality of actuator devices 30, shown only schematically, are fashioned in first substrate 2 at a distance from one another. In regions 30' of first substrate 2, situated at the corners of later micromechanical components 100 and 100', no actuator devices 30 are fashioned. Substrate 2 can remain massive in regions 30'. Spacing d4 between later micromechanical components 100 and 100' corresponds to a width of the at least one first separating trench 41.

FIG. 1*e-iii* shows a schematic plan-type view of a third segment of the layer construction along the sectional plane C-C', which runs parallel to first rear side R2 centrically through the at least one control ASIC 12.

The at least one control ASIC 12 is accommodated by the at least one opening 17 in second substrate 14. In a geometrical projection onto first front side F2 of the first substrate (or a surface parallel thereto), the at least one control ASIC 12 overlaps, respectively, either four actuator devices 30 or three actuator devices 30 and one of the regions 30'. The position of the at least one via 18 is depicted by a via device 18' that includes the at least one via 18. The precise realization of the at least one via 18 is a function of the realization of first, second, and third printed conductors 3, 16, 19'.

Spacing d5 between edge surfaces structured out from second substrate 14 of later micromechanical components 100 and 100' can be the same size as spacing d4.

FIG. 1*e-iv* shows a schematic plan view of a rear side of the layer construction.

According to FIG. 1*e-iv*, contact surfaces 19 are electrically connected via a multiplicity of wired connections 50 for example to contact surfaces 52, which are electrically connected to the at least one via 18.

As shown in FIG. 1*f*, in a further method step the layer construction (substrate stack) can be attached to a bearer substrate 32 via assembly elements 20. Here, the substrate stack can be fixed on bearer substrate 32 in particular by a magnetic force. Openings 33 can be fashioned in the bearer substrate. Openings 33 can for example facilitate the removal of the component from bearer substrate 33, or can enable a measurement. Openings 33 can be fashioned underneath some or all control ASICs 12, and/or underneath some or all contact surfaces 19.

In a further method step, base substrate 56 of SOI wafer 50 is removed. Advantageously, this takes place by a grinding process or by a wet or dry etching process, in particular using a $ClF_3$ gas phase etching process or an $SF_6$ plasma etching process.

In a further method step, an HF gas phase etching process is carried out in which insulating layer 54 of the wafer and covering elements 41, 42, 42', 44 are removed. In this way, micromechanical components 100 and 100' are separated, and regions 2A, 2B, and 2C of the first substrate are separated from one another, and regions 14A, 14B, and 14C of the second substrate or also separated from one another. Through the removal of insulating layer 54 of the wafer, mirror elements 6 are given their freedom of movement.

Figure 1G:
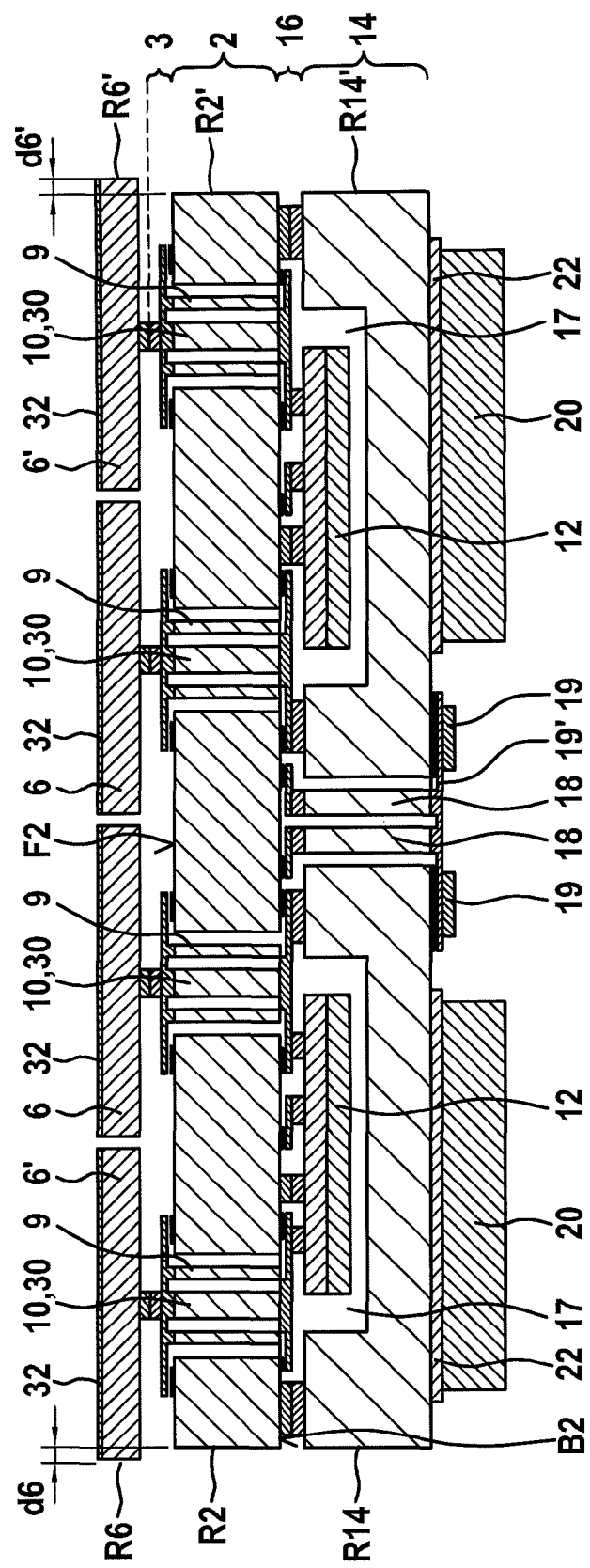

According to FIG. 1*g*, in a further method step a reflective coating 32 is applied onto a surface (oriented away from the (rest of) substrates 2 and 14) of mirror elements 6, 6', 6", in order to form reflective surfaces 32, for example using a mirror metallization method. In a further method step, the micromechanical components can be removed from bearer substrate 33, for example with the aid of rods introduced through openings 33.

According to FIG. 1*g*, mirror elements 6' fashioned on a lateral edge of the component, i.e. fashioned on an outer side of the component that is situated essentially perpendicular to first front side F2 of first substrate 2, have a lateral edge surface R6, R6' on the same lateral edge of the component. Lateral edge surface R6, R6' is likewise fashioned essentially perpendicular to first front side F2 of first substrate 2 and essentially parallel to the outer side of the component on the lateral edge of the component on which mirror element 6' is fashioned.

According to FIG. 1*f*, in the rest position of mirror element 6' lateral edge surface R6, R6' of mirror element 6' protrudes past lateral edge surface R2, R2' of the first substrate, which surface R2, R2' is fashioned on the same lateral edge of the component as lateral edge surface R6, R6' of mirror element 6', essentially perpendicular to first front side F2 of first substrate 2. In addition, in the rest position of mirror element 6', lateral edge surface R6, R6' of mirror element 6' protrudes past lateral edge surface R14, R14' of the second substrate, which lateral edge surface R14, R14' is fashioned on the same lateral edge of the component as lateral edge surface R6, R6' of mirror element 6', essentially perpendicular to first front side F2 of first substrate 2. Here, "protrudes past" means that in the rest position of mirror element 6', lateral edge surface R6, R6' is fashioned at a distance d6, d6' from lateral edge surface R2, R2', R14, R14' of first and/or second substrate 2, 14, distance d6, d6' taking positive values. Distance d6, d6' is measured along a direction parallel to first front side F2 of first substrate 2 and perpendicular to the corresponding lateral mirror surface R6, R6', and is in addition measured positively in the direction of a further lateral edge of the component that faces away from the lateral edge of the component on which the corresponding mirror element 6' is fashioned.

This can be the case on all lateral edges of the component, where lateral edges, as described, are edges that are fashioned essentially perpendicular to second front side F2 of the first substrate and/or that are not parallel to second front side F2 of the first substrate. However, it can also be provided that, at least on a lateral edge of the component, edge surface R2, R2' of first substrate 2 and/or edge surface R14, R14' of second substrate 14 protrudes past edge surface R6, R6', fashioned on the same edge of the component, of mirror element 6'. In this case, distance d6, d6', as defined above, would take on negative values.

Advantageously, edge surface R6, R6' of mirror elements 6' is fashioned at a distance d6 having a value in a range of from 10 to 100 µm, in particular 30 to 80 µm, in particular 40 to 60 µm, or less in each case, from the edge surface R2, R2', R14, R14' that, with the exception of edge surfaces R6, R6' of mirror elements 6', extends the furthest outward on the corresponding edge of the component. According to FIG. 1*g*, edge surfaces R2 and R14 on a first edge of the component (at left in FIG. 1*g*) and edge surfaces R2' and R14' on a second edge of the component (at right in FIG. 1*g*) that faces away from the first edge of the component extend equally far outward. An alternative realization of edge surfaces R6, R6', R2, R2' is explained with reference to FIG. 2.

Figure 2:
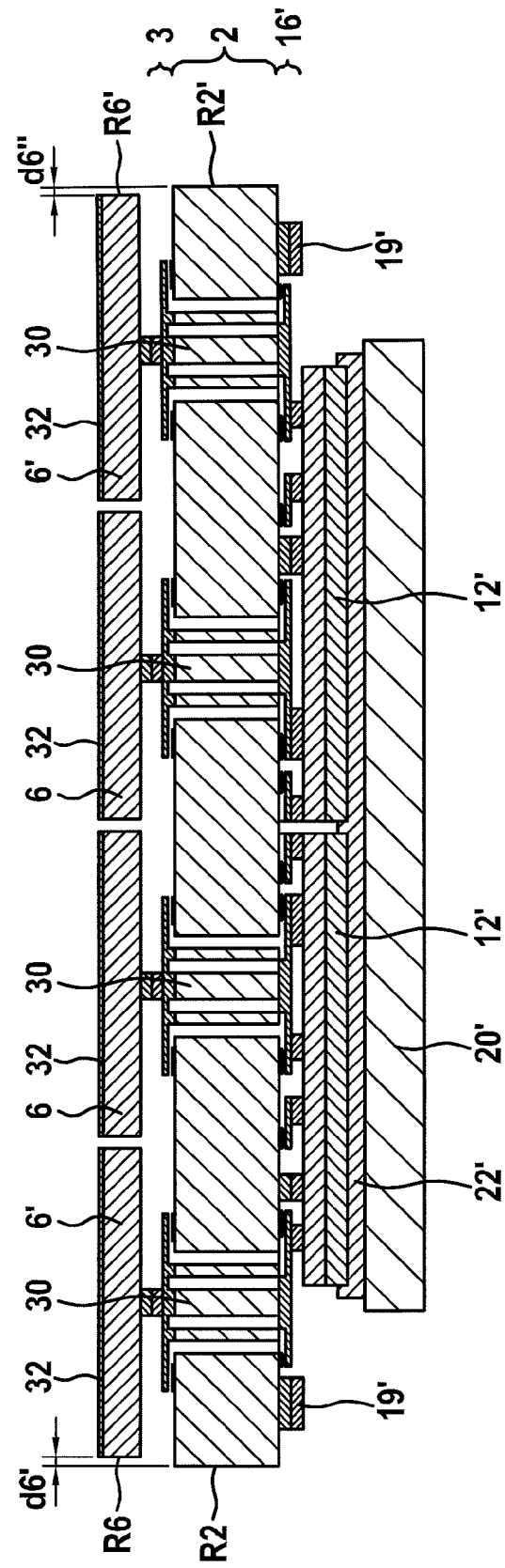
FIG. 2 shows a cross-section-type side view of a micromechanical component according to a first specific embodiment.

FIG. 2 shows a cross-section-type side view of a micromechanical component according to a first specific embodiment.

In the specific embodiment of FIG. 2, the micromechanical component does not have any region structured out from second substrate 14. Instead, at least one assembly element 20' is situated on at least one respective control ASIC 12'. In particular, a single assembly element 20' is glued onto a plurality of ASICs 12' via an adhesive layer 22', and edge surfaces R2, R2', R6, R6', fashioned on the micromechanical component, extend past assembly elements 20' at least at one side, in particular at least at two sides, in particular at all sides.

In this specific embodiment, the at least one control ASIC 12' can be controlled via two printed conductors 16' that are fashioned on front side F2 of first substrate 2. In particular, the at least one control ASIC 12 can be controlled via contact surfaces 19' fashioned in second printed conductors 16', which contact surfaces are fashioned in the regions of first rear side B2 of first substrate 2 that are not covered by assembly element 20'.

As is shown in FIG. 2, at least one edge surface R2, R2' of first substrate 2 protrudes past an edge surface R6, R6' of mirror elements 6' situated on the edge of the micromechanical component. With regard to the above-described production method, this can be achieved in that the width of trenches 22 is selected to be greater than the width of first separating trenches 42 (see FIG. 1c and associated description). Such a relation of the width of trenches 22 and of first separating trench 42 and/or of second separating trench 44, or distances d12 (see FIG. 1e-i and associated description) and d4 (see FIG. 1e-ii and associated description) can also be provided in the micromechanical components according to other specific embodiments. This can for example be advantageous if the positioning of the component at its location cannot be accomplished with a high degree of precision. The component can then for example be pushed laterally until it reaches a limit without thereby causing damage to mirror elements 6'.

Moreover, it is advantageous if distance d6', d6" of edge surface R6, R6' of mirror elements 6' of that edge surface R2, R2' of first substrate 2 that, with the exception of edge surfaces R6, R6' of mirror elements 6', extends furthest outward on the corresponding edge of the component, i.e. in a direction that is oriented away from the component and preferably stands perpendicular on the edge of the component, is fashioned, in a direction perpendicular to edge surface R6, R6', with a distance value d6', d6" having a value in a range of from 10 to 100 µm, in particular 30 to 80 µm, in particular 40 to 60 µm, or less in each case.

In contrast, the above-described variant according to FIG. 1g, in which edge surfaces R6, R6' of mirror elements 6' 6" situated on the edge of the component protrude past corresponding edge surfaces R2, R2', R14, R14' of first and second substrate 2, 14, is advantageous if a very precise positioning is possible, so that the mirror surface can be as large as possible relative to the base surface required for the attachment of the component.

Advantageously, one or more or all edge surfaces R6, R6' of mirror elements 6' 6" that are situated on the edge of the component can be fashioned within a range of from 10 to 100 µm, in particular within a range of from 40 to 60 µm, around a corresponding edge surface R2, R2' of first and/or second substrate 2, 14.

Figure 3:
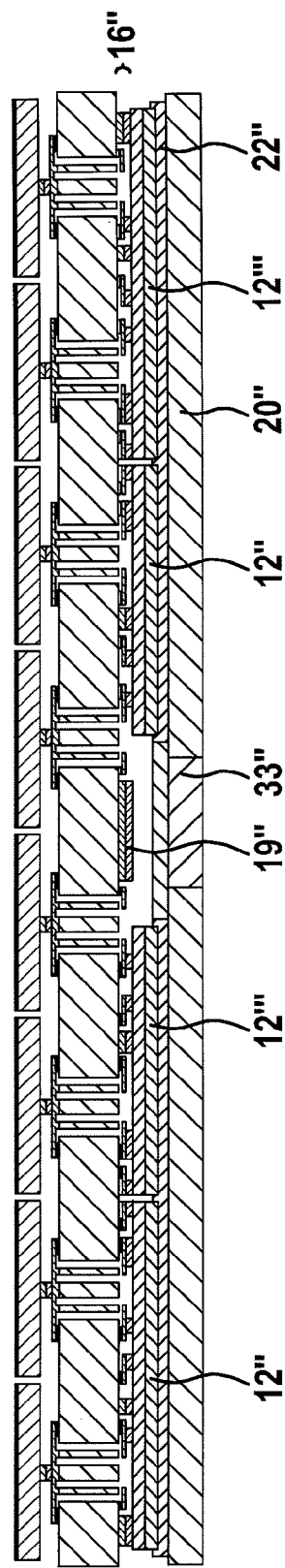
FIG. 3 shows a cross-section-type side view of a micromechanical component according to a second specific embodiment.

FIG. 3 shows a cross-section-type side view of a micromechanical component according to a second specific embodiment.

The second specific embodiment is a variant of the first specific embodiment. For clarity, elements of the second specific embodiment that are identical to or analogous to the corresponding above-described elements are in part not described again. In the example of FIG. 3, a single assembly element 20" essentially extends over the entire surface of the micromechanical component. Assembly element 20" is glued onto at least one control ASIC 12" via an adhesive layer 22".

In order to enable a controlling of control ASIC 12" via two printed conductors 16" fashioned on first rear side B2 of first substrate 2, in assembly element 20" and adhesive layer 22" there is fashioned at least one opening 33" that vertically passes completely through assembly element 20" and adhesive layer 22". One or more rods can be introduced through the at least one opening 33" in order to raise the micromechanical component from the bearer substrate. A controlling of the at least one control ASIC 12" can also take place through the at least one opening 33" in that one or more contact surfaces 19" fashioned over the at least one opening 33" are contacted and for example charged with a digital signal.

Although the present invention has been described above on the basis of preferred exemplary embodiments, it is not limited thereto, but rather can be modified in many ways. In particular, the present invention can be modified in many ways without departing from the core idea of the present invention.

What is claimed is:

1. A micromechanical component, comprising:
    a first substrate having a first front side and a first rear side facing away from the first front side;
    a plurality of first printed conductors that are fashioned on the first front side of the first substrate;
    a plurality of actuator devices that are fashioned at least one of on and in the first substrate and that are electrically bonded to the first printed conductors, wherein each actuator device includes:
        at least one stator electrode, and
        at least one actuator electrode that works together with the at least one stator electrode, each actuator device being fashioned such that a voltage can be applied between the at least one actuator electrode and the at least one cooperating stator electrode in such a way that the at least one actuator electrode can be displaced relative to the at least one stator electrode;
    a plurality of second printed conductors that are fashioned on the first rear side of the first substrate and are electrically connected to the first printed conductors; and
    at least one control ASIC fastened at least one of to, over, and on the first rear side of the first substrate and electrically bonded to the second printed conductors in such a way that the voltage that can be applied between the at least one actuator electrode and the at least one cooperating stator electrode of each actuator device can be controlled by the at least one control ASIC.

2. The micromechanical component as recited in claim 1, wherein the first printed conductors and the second printed conductors are electrically connected to one another within the first substrate.

3. The micromechanical component as recited in claim 1, further comprising:
    at least one mirror element that has a reflective surface and that is connected to the at least one actuator electrode and that can be displaced together with the at least one actuator electrode being fashioned on each of the actuator devices.

4. The micromechanical component as recited in claim 3, wherein at least one spacing between two adjacent mirror elements in at least one direction oriented parallel to the first front side is smaller, by at least a factor of 8, than a width of the two adjacent mirror elements in the same direction.

5. The micromechanical component as recited in claim 1, further comprising at least one ferromagnetic assembly element situated on the at least one control ASIC.

6. The micromechanical component as recited in claim 1, further comprising:
   a second substrate having a second front side and a second rear side facing away from the second front side, wherein:
      the second substrate is fastened, via the second front side at least one of to, over, and on the second printed conductors, and
      the second substrate includes, on the second front side, at least one opening within which the at least one control ASIC is situated.

7. The micromechanical component as recited in claim 6, further comprising at least one ferromagnetic assembly element situated on the second rear side of the second substrate.

8. The micromechanical component as recited in claim 6, wherein:
   the second substrate includes at least one via from the second rear side up to the second front side, and
   the at least one via is electrically connected to each of the second printed conductors and to at least one contact surface on the second rear side of the second substrate.

9. A method for producing a micro-electromechanical component, comprising:
   forming first printed conductors on a first front side of a first substrate;
   formation a plurality of actuator devices at least one of on and in the first substrate that are electrically bonded to the first printed conductors, wherein each of the actuator devices is respectively connected to at least one stator electrode and to at least one actuator electrode that works together with the at least one stator electrode, in such a way that when there is an application of a voltage between the at least one actuator electrode and the at least one cooperating stator electrode, the at least one actuator electrode is displaced relative to the at least one stator electrode;
   forming second printed conductors, which are electrically connected to the first printed conductors, on a first rear side, facing away from the first front side, of the first substrate; and
   fastening at least one control ASIC at least one of to, over, and on the second printed conductors, the at least one control ASIC being electrically bonded to the second printed conductors in such a way that the application of the voltage between the at least one actuator electrode and the at least one cooperating stator electrode of each of the actuator devices is controlled by the at least one control ASIC.

10. The method as recited in claim 9, further comprising:
   fastening a second substrate having a second front side and a second rear side facing away from the second front side, via the second front side at least one of to, over, and on the second printed conductors, the at least one control ASIC being situated in at least one opening fashioned on the second front side of the second substrate.

11. The method as recited in claim 9, further comprising:
   etching a plurality of mirror elements at a distance from one another out from a semiconductor layer of a wafer, using an insulating layer situated between the semiconductor layer and a base substrate of the wafer as an etch stop layer;
   fastening the mirror elements at least one of to, over, and on the first printed conductors;
   removing the base substrate and the insulating layer to expose the mirror elements; and
   fashioning reflective surfaces on the exposed mirror elements.

12. The method as recited in claim 9, further comprising:
   fashioning at least one bridging element on the first front side of the first substrate;
   after the forming of the at least one bridging element, forming at least one continuous separating trench from the first rear side to the first front side through the first substrate on the at least one bridging element, in such a way that regions are structured out from the first substrate, the regions remaining mechanically connected to one another via the at least one bridging element; and
   removing the at least one bridging element during a later separation of micro-electromechanical components.

* * * * *